United States Patent
Sultenfuss et al.

(10) Patent No.: US 10,996,276 B2
(45) Date of Patent: May 4, 2021

(54) HOST ILLUMINATION OF INDICATORS OF AN AC ADAPTER

(71) Applicant: Dell Products, L.P., Round Rock, TX (US)

(72) Inventors: Andrew Thomas Sultenfuss, Leander, TX (US); Priyank Jatin Gajiwala, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 134 days.

(21) Appl. No.: 16/258,372

(22) Filed: Jan. 25, 2019

(65) Prior Publication Data

US 2020/0241073 A1    Jul. 30, 2020

(51) Int. Cl.
| | |
|---|---|
| H02J 7/02 | (2016.01) |
| G01R 31/36 | (2020.01) |
| H02J 7/04 | (2006.01) |
| F21V 8/00 | (2006.01) |
| G01R 31/382 | (2019.01) |
| G02B 6/42 | (2006.01) |
| H05B 45/10 | (2020.01) |

(52) U.S. Cl.
CPC ....... *G01R 31/3646* (2019.01); *G01R 31/382* (2019.01); *G02B 6/0006* (2013.01); *G02B 6/4298* (2013.01); *H02J 7/04* (2013.01); *H05B 45/10* (2020.01)

(58) Field of Classification Search
CPC .................................................. G02B 6/0006
USPC ......................................................... 320/132
See application file for complete search history.

(56) References Cited

U.S. PATENT DOCUMENTS

| | | | |
|---|---|---|---|
| 6,215,295 B1 | 4/2001 | Smith, III | |
| 2002/0008101 A1 | 1/2002 | Hauschulz | |
| 2002/0160656 A1* | 10/2002 | Nishita | G02B 6/4277 439/577 |
| 2003/0201676 A1* | 10/2003 | Su | H02M 7/003 307/149 |

(Continued)

OTHER PUBLICATIONS

International Search Authority (ISA), "International Search Report," International Application No. PCT/US2019/60949, dated Jan. 27, 2020, 2 pages, publisher Commissioner for Patents—PCT, Alexandria, Virginia, United States of America.

(Continued)

*Primary Examiner* — Edward Tso
*Assistant Examiner* — Ahmed H Omar
(74) *Attorney, Agent, or Firm* — Fogarty LLP

(57) ABSTRACT

An AC adapter charges an Information Handling System (IHS) and includes a first DC plug including a DC connector that is compatible with an IHS power port. The first DC plug includes a first light guide for receiving light transmitted from the IHS and for illuminating an indicator of the first DC plug. The first DC plug comprises a fiber optic wire that receives the light received by the first light guide and illuminates the indicator. The fiber optic wire may extend within the DC cord and may illuminate an indicator of a second DC plug on the opposite end of the cord. The DC cord may include indicators illuminated by the fiber optic wire extending within the cord. The fiber optic wire terminates at a light guide of the second DC plug and exits the light guide of the second DC plug when the second DC plug is uncoupled.

20 Claims, 3 Drawing Sheets

(56) References Cited

U.S. PATENT DOCUMENTS

2005/0212526 A1 9/2005 Blades
2016/0356670 A1* 12/2016 Brillhart ............ H04B 10/0731

OTHER PUBLICATIONS

International Search Authority (ISA), "Written Opinion of the International Searching Authority," International Application No. PCT/US2019/60949, dated Jan. 27, 2020, 6 pges, publisher Commissioner for Patents—PCT, Alexandria, Virginia, United States of America.

* cited by examiner

HOST ILLUMINATION OF INDICATORS OF AN AC ADAPTER

FIELD

This disclosure relates generally to Information Handling Systems (IHSs), and more specifically, to AC (Alternating Current) adapters for charging portable IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Certain IHSs, such as laptops, tablets and mobile phones, are portable and are designed to operate using power supplied by rechargeable batteries. Power drawn from an electrical outlet may be used to charge the batteries of a portable IHS. Since the batteries of IHSs typically operate using DC (Direct Current) power, an AC adapter (i.e., AC/DC adapter or AC/CD converter) is required to convert the AC power from the wall outlet to DC power that can be used to charge the batteries. On one end, AC adapters include an AC plug that is inserted into the outlet. On the other end, AC adapters include a DC plug that includes a connector that is received by a power port of the portable IHS, where the power port is typically on a side or an edge of the IHS enclosure.

SUMMARY

In various embodiments, an AC (Alternating Current) adapter is provided for charging an Information Handling System (IHS). The AC adapter includes a first DC (Direct Current) plug including a DC connector that is compatible with a power port of the IHS. The first DC plug includes a first light guide for receiving light transmitted from the IHS. The light received by the first light guide illuminates an indicator portion of the first DC plug.

In additional AC adapter embodiments, the first DC plug includes a fiber optic wire that receives the light received by the first light guide and illuminates the indicator portion of the first DC plug. In additional embodiments, the AC adapter also includes a DC cord extending at a first end from the first DC plug, wherein the fiber optic wire comprised within the first DC plug extends within the DC cord. In additional embodiments, the AC adapter also includes a second DC plug connected to a second end of the DC cord, wherein the fiber optic wire extending from within the DC cord illuminates an indicator portion of the second DC plug. In additional AC adapter embodiments, the DC cord comprises one or more indicators illuminated by the fiber optic wire extending within the DC cord. In additional AC adapter embodiments, the fiber optic wire terminates a light guide of the second DC plug and wherein a portion of the light received by the first light guide exits the light guide of the second DC plug when the second DC plug is uncoupled. In additional AC adapter embodiments, the first indicator is illuminated to indicate a charging state of the IHS.

In various additional embodiments, an Information Handling System (IHS) includes: a first power port compatible with a DC connector of a first DC (Direct Current) plug of an AC adapter; a first light source operable for transmitting light for reception by a first light guide of the first DC plug when the DC connector is coupled to the first power port; and a power port controller configured to initiate transmissions by the first light source to indicate a charging status of the IHS.

In additional embodiments, the IHS also includes a second light source operable for transmitting light for reception by a second light guide of the first DC plug when the DC connector is coupled to the first power port. In additional IHS embodiments, the first light source transmission received by the first light guide illuminates an indicator portion of the first DC plug. In additional IHS embodiments, the first light source transmission received by the first light guide is transmitted along a fiber optic wire extending from the first light guide along the length of a DC cord extending at a first end from the first DC plug. In additional IHS embodiments, the power port controller determines the intensity of the transmitted light based on the length of the DC cord.

Various additional embodiments provide a system for charging an Information Handling System (IHS). The system includes: an AC adapter comprising a first DC (Direct Current) plug including a DC connector that is compatible with a power port of the IHS. The first DC plug includes a first light guide for receiving light transmitted from the IHS, and the light received by the first light guide illuminates an indicator portion of the first DC plug. The system further includes a first power port of the IHS, wherein the first power port comprises a first light source operable for transmitting the light received by the first light guide when the DC connector is coupled to the first power port.

In additional system embodiments, the first DC plug comprises a fiber optic wire that receives the light received by the first light guide and illuminates the indicator portion of the first DC plug. In additional embodiments, the system also includes a DC cord extending at a first end from the first DC plug, wherein the fiber optic wire comprised within the first DC plug extends within the DC cord. In additional embodiments, the system also includes a second DC plug connected to a second end of the DC cord, wherein the fiber optic wire extending from within the DC cord illuminates an indicator portion of the second DC plug. In additional system embodiments, In additional system embodiments, the DC cord comprises one or more indicators illuminated by the fiber optic wire extending within the DC cord. In additional system embodiments, the first light guide aligns with the first light source upon insertion of the DC connector in the first power port. In additional system embodiments, the power port further includes a second light source operable for transmitting light for reception by a second light guide of the first DC plug when the DC connector is coupled to the first power port. In additional system embodiments, the power port controller is further configured to initiate transmissions by the first light source to indicate a charging status of the IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Figure 1:
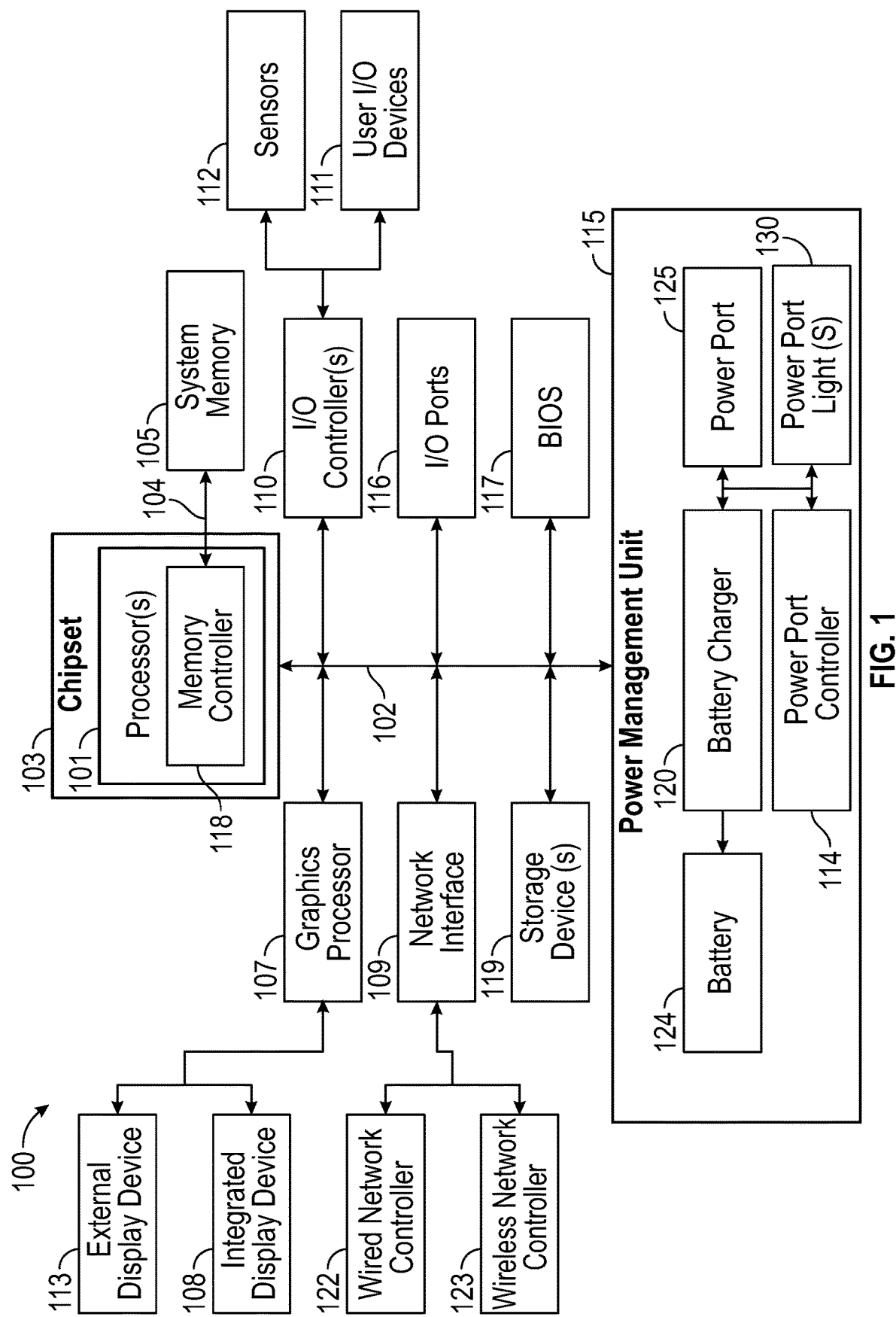
FIG. 1 is a block diagram depicting certain components of an IHS operable according to various embodiments for illuminating indicator lights incorporated in an AC power adapter.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows an example of an IHS configured to implement the systems and methods described herein according to certain embodiments. It should be appreciated that although certain IHS embodiments described herein may be discussed in the context of a personal computing device, other embodiments may be utilized.

As described, certain portable IHSs may utilize AC adapters for drawing power from an electrical outlet and converting the power for use in recharging internal batteries from which the portable IHSs operate. Certain AC adapters may include one or more indicator lights that may be illuminated in response to detecting that the AC plug of the adapter has been plugged into electrical outlet such that the AC adapter is powered and available for use. Certain existing AC adapters may utilize indicator lights that are illuminated as long as the AC adapter is connected to a powered electrical outlet and regardless of whether the AC adapter is coupled to an IHS. Such existing AC adapter indicator lights are illuminated via light sources included in the AC adapter.

FIG. 1 is a block diagram illustrating certain components of an IHS 100 configured according to certain embodiments for providing light sources used to illuminate indicator lights incorporated in an AC power adapter being used to charge the IHS 100. In various embodiments, IHS 100 may include a power management unit 115 that includes logic that executes program instructions to perform certain of the operations disclosed herein for illuminating indicator lights incorporated in an AC power adapter. While a single IHS 100 is illustrated in FIG. 1, IHS 100 may be a component of an enterprise system that may include any number of additional IHSs that may also be configured in the same or similar manner to IHS 100.

IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104.

The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109 that may support different types of network connectivity. In certain embodiments, IHS 100 may include one or more Network Interface Controllers (NIC), each of which may implement the hardware required for communicating via a specific networking technology, such as BLUETOOTH, Ethernet and mobile cellular networks (e.g., CDMA, TDMA, LTE). As illustrated, network interface 109 may support network connections by wired network controllers 122 and wireless network controller 123. Each network controller 122, 123 may be coupled via various buses to the chipset 103 of IHS 100 in supporting different types of network connectivity, such as the network connectivity utilized in applications of the operating system of IHS 100.

Chipset 103 may also provide access to one or more display device(s) 108, 113 via graphics processor 107. In certain embodiments, graphics processor 107 may be comprised within a video or graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. As illustrated, IHS 100 may support an integrated display device 108, such as a display integrated into a laptop, tablet, 2-in-1 convertible device, or mobile device. IHS 100 may also support use of one or more external displays 113, such as external monitors that may be coupled to IHS 100 via various types of couplings.

In certain embodiments, chipset 103 may utilize one or more I/O controllers 110 that may each support hardware components such as user I/O devices 111 and sensors 112. For instance, I/O controller 110 may provide access to one or more user I/O devices 110 such as a keyboard, mouse, touchpad, touchscreen, microphone, speakers, camera and other input and output devices that may be coupled to IHS 100. Each of the supported user I/O devices 111 may interface with the I/O controller 110 through wired or wireless connections.

In certain embodiments, sensors 112 accessed via I/O controllers 110 may provide access to data describing environmental and operating conditions of IHS 100. For instance, sensors 112 may include geo-location sensors capable for providing a geographic location for IHS 100, such as a GPS sensor or other location sensors configured to determine the location of IHS 100 based on triangulation and network information. Various additional sensors, such as optical, infrared and sonar sensors, that may provide support for xR (virtual, augmented, mixed reality) sessions hosted by the IHS 100.

Other components of IHS 100 may include one or more I/O ports 116 the support removeable couplings with various types of peripheral external devices. For instance, I/O 116 ports may include USB (Universal Serial Bus) ports, by which a variety of external devices may be coupled to IHS 100. I/O ports 116 may include various types of ports and couplings that support connections with external devices and systems, either through temporary couplings via ports, such as USB ports, accessible to a user via the enclosure of the IHS 100, or through more permanent couplings via expansion slots provided via the motherboard or via an expansion card of IHS 100, such as PCIe slots.

Chipset 103 also provides processor 101 with access to one or more storage devices 119. In various embodiments, storage device 119 may be integral to the IHS 100, or may be external to the IHS 100. In certain embodiments, storage device 119 may be accessed via a storage controller that may be an integrated component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud drive accessible via network interface 109.

As illustrated, IHS 100 also includes a BIOS (Basic Input/Output System) 117 that may be stored in a non-volatile memory accessible by chipset 103 via bus 102. Upon powering or restarting IHS 100, processor(s) 101 may utilize BIOS 117 instructions to initialize and test hardware components coupled to the IHS 100. The BIOS 117 instructions may also load an operating system for use by the IHS 100. The BIOS 117 provides an abstraction layer that allows the operating system to interface with the hardware components of the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

In the illustrated embodiment, IHS 100 also includes a power management unit 115 that receives power inputs used for charging batteries 124 from which the IHS 100 operates. IHS 100 may include one or more power ports 125 to which an AC adapter may be coupled. As described, an AC adapter may draw AC from an electrical outlet and convert the AC to a DC output that is provided to an IHS via a DC connector. The DC connector portion of an AC adapter may be inserted into a compatible power port 125 of an IHS 100, thus providing the power to the IHS. The DC power input received at power port 125 may be utilized by a battery charger 124 for recharging one or more internal batteries 124 of IHS 100.

In certain embodiments, power management unit 115 of IHS 100 may include a power port controller 114 that is operable for controlling one or more power port light sources 130 used for illuminating indicator lights incorporated in an AC power adapter. As described in additional detail with regard to the below embodiments, an AC adapter may incorporate light guide structures for receiving light generated by power port light sources 130 and transmitted from the IHS for use in illuminating one or more indicators of the AC adapter. In certain embodiments, light transmitted by the IHS may be received in light guide or other optical structures incorporated in the DC plug cord of an AC adapter that is coupled to the power port of the IHS. The light received by the light guide may be transmitted along the length of the DC cord of the AC adapter via a fiber optic wire embedded within the DC cord. In this manner, light generated by the power port light sources 130 of IHS may be utilized to illuminate indicators located at multiple locations along the DC cord of an AC adapter.

In support of such capabilities, IHS 100 may include a power port controller 114 that is configured to detect the coupling of an AC adapter to power port 125. Upon detecting the coupling of an AC adapter, the power port controller 114 may interrogate the AC adapter in order to determine whether the AC adapter supports indicator lights that may be illuminated by a light source provided by the IHS 100. In certain embodiments, the AC adapter may be configured to report PSID (power supply identification) information that specifies attributes of the AC adapter, such as a manufacturer, rating and model number. In certain embodiments, such attributes may also specify whether the AC adapter includes support for illumination of indicators using a light source provided by the IHS 100. In certain embodiments, such attributes may specify a type of illumination by the IHS 100 that is supported, such as a specific physical configuration of power port light sources 130 that may be received by the AC adapter. As described in additional detail with regard to FIG. 4, an IHS 100 may include multiple light sources 130 that are each located at positions adjacent to the power port. Different AC adapters may include light guides that are compatible with power port light sources 130 positioned at different locations adjacent to the power port.

In response to detecting an AC adapter that supports illumination of indicators by the IHS 100, the power port controller 114 may activate one or more power port light sources 130. As described in additional detail with regard to FIG. 4, an IHS 100 may include multiple power port light sources 130, such as an LED, mini-LED or micro-LED, that emits a beam of light via a lens or other light guide that is located at a position adjacent to the power port 125, such that a beam of transmitted light may be received by a corresponding lens or light guide incorporated within the DC plug. Once the DC plug is coupled to the power port 125 via insertion of a DC connector into a compatible receptacle of the power port 125, light generated by power port light sources 130 may be received by the light guide of the DC plug and used to illuminate one or indicators of the AC adapter.

In certain embodiments, the power port controller 114 may be configured to determine the intensity of light to be provided by the power port light sources 130 in order to illuminate the indicators included within a specific type of AC adapter. In certain embodiments, power port controller 114 may be configured to operate multiple power port light sources 130 identically, such that each of the multiple light sources is turned off and on simultaneously and each light source is configured to emit the same intensity and color. In certain embodiments, power port controller 114 may be configured to operate multiple power port light sources 130 independently, such that each light source may be independently turned off and on and each light source may be configured to emit a different intensity and/or color of light. In certain embodiments, the power port controller 114 may be configured to determine an intensity or other strength of a light source transmission based on the length of the fiber optic wire embedded within the AC adapter.

In certain embodiments, power port controller 114 may be a component of a system-on-chip from which the power management unit 115 operates. In certain embodiments, power port controller may an embedded controller that is a motherboard component of IHS 100, or a component of a power management unit 115 daughter card of IHS 100. In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
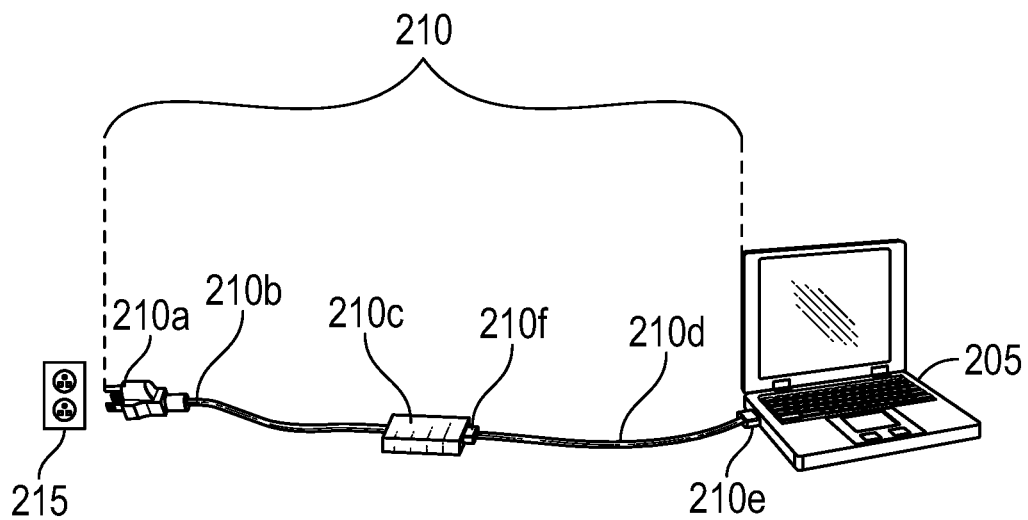
FIG. 2 is a diagram depicting certain components of charging system, according to various embodiments, that includes an AC adapter that is coupled to a laptop computer configured for illuminating indicator lights incorporated in the AC adapter.

FIG. 2 is a diagram depicting components of charging system according to various embodiments, where that system includes an AC power adapter 210 coupled to an IHS that is a laptop computer 205. In the illustrated embodiment, AC power adapter 210 is used to charge the internal batteries of laptop computer 205. In other embodiments, AC power adapter 210 may be similarly used to charge the batteries of other types of portable IHSs, such as tablets, 2-1 convertible laptops, mobile phones and smart watches. Embodiments may be implemented using all varieties of IHSs that operate on DC power supplied by internal rechargeable batteries and that also utilize an AC converter that may be plugged into an electrical outlet 215 in order to charge the batteries of an IHS.

An AC power adapter 210 according to embodiments may include several connected components that operate to draw AC power from an electrical outlet 215 and convert the AC input power to a DC output for delivery to an IHS, such as the laptop 205 of FIG. 2. One end of the AC power adapter 210 includes an AC plug 210a that includes prongs that may be inserted into slots provided by an AC electrical outlet 215. Many different types of AC plugs 210a are utilized throughout the world, with different plugs from different regions utilizing different numbers, shapes and orientations of the prongs that conform to the electrical outlets used in a region. In North America, most general-purpose electrical outlets deliver 120 V of AC at a frequency of 60 hertz.

As illustrated, an AC electrical cord 210b of AC adapter 210 connects AC plug 210a to converter 210c. One function of converter 210c is to convert the AC received from power cord 210b to DC that can be used to power IHSs compatible with the AC adapter 210. In certain instances, converter 210c may be referred to as a power brick. The output generated by converter 210c may be DC within a voltage range that supports the power requirements of IHSs compatible for charging using AC adapter 210. As described in additional detail with regard to FIG. 4, converter 210c may also support identification of the AC adapter 210 to the coupled IHS, where this identification information may be utilized in illuminating one or more indicator lights of the AC adapter. The DC output generated by converter 210c is provided to laptop 205 via a DC power cord 210d that supplies the DC output via a connector that is received by a power port of the laptop. In FIG. 2, the connector is enclosed within a DC plug 210e and is thus not visible. The DC plug 210e portion of AC power adapter 210 is described in additional detail with regard to FIGS. 3A and 3B.

In the illustrated embodiment, DC cord 210d also includes a DC plug 210f that may be received by a power port of converter 210c. Similar to DC plug 210e coupled to IHS 205, the DC plug 210f on the opposite end of DC cord 210d may be removed from the power port of converter 210c. In certain embodiments, DC plug 210e and DC plug 210f may be interchangeable for use in the power port of either converter 210c or IHS 205. In this manner, DC cord 210d may be reversible, such as a USB-C cable with USB-C connectors on each end. In such embodiments, both DC plug 210e and DC plug 210f may include indicator lights such as described in additional with regard to FIGS. 3A and 3B, where the indicators of each of the DC plugs 210e and DC plug 210f may be illuminated by power port light sources of IHS 205. In certain non-illustrated embodiments, DC cord 210d may be fixed to converter 210c but may still support the indicator illumination features described herein.

As described, an IHS, such as laptop 205, may include one or more power port light sources that may be used to illuminate indicators comprised within an AC adapter 210 that is coupled to a power port of the laptop 205. Similarly, in certain embodiments, converter 210c of the AC adapter 210 may include one or more light sources that may be used in this same manner to transmit light to the DC power cord 210d and illuminate indicators provided by the DC power cord 210d. In some embodiments, the light generated by the power port light sources and received by a DC plug 210e or DC plug 210f may be transmitted along the length of DC power cord 210d via a fiber optic wire that is embedded within the DC power cord 210d. Utilizing this fiber optic wire, indicators on both ends and along the length of DC power cord 210d may be illuminated using light sources provided either by the converter 210c, or by a power port light source of IHS 205.

Figure 3A:
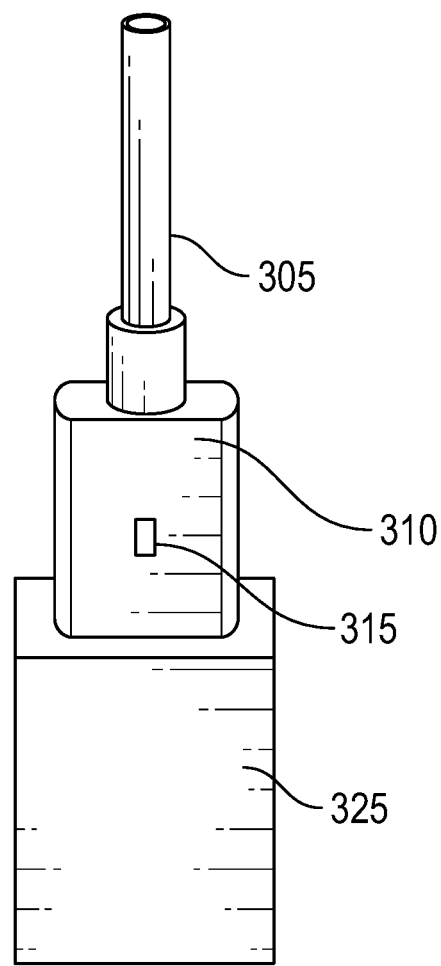
FIG. 3A is a diagram depicting certain components of a DC plug, according to various embodiments, of an AC power adapter, where the DC plug is received by a power port of an IHS.
Figure 3B:
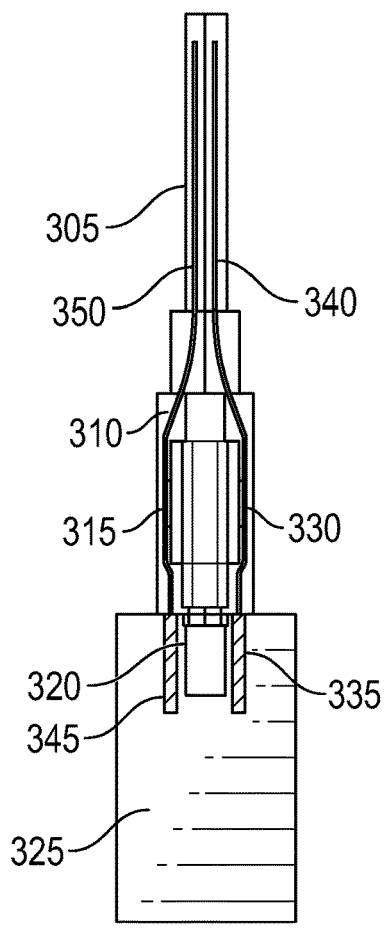
FIG. 3B is a diagram depicting a cutaway view of a DC plug according to various embodiments, such as the DC plug and IHS portion of FIG. 3A.

FIGS. 3A and 3B are diagrams depicting certain components of a DC plug 310, according to various embodiments, of an AC adapter, where the DC plug 310 includes a connector 320 that is received by a power port of an IHS 325. As described, a converter component of an AC adapter may alternatively or additionally provide light sources for illumination of a DC cord indicators. Accordingly, in certain embodiments, DC plug 310 is received by a power port of such a converter in the same manner as IHS 325. In certain embodiments, DC plug 310 may be connected to an identical DC plug 310 via DC cord 305, thus providing a reversible cable.

As illustrated in FIG. 3A, the DC plug 310 includes an indicator 315 that is visible to the user of the IHS 325 to which the AC adapter is coupled. In certain embodiments, indicator 315 may be a translucent portion of DC plug 310 that allows light emitted from within DC plug 310 to be visible to the user. As described in additional detail with regard to FIG. 4, indicator 315 may be illuminated via light emitted from a fiber optic wire 350 that is embedded within DC plug 310. Although not visible in FIG. 3A, the cross-section of DC plug 310 in FIG. 3B depicts an additional indicator 330 located on the opposite side of the DC plug 310 from indicator 315. In the illustrated embodiment, indicator 330 is illuminated by light emitted from an additional fiber optic wire 340 embedded within DC plug 310. In certain embodiments, both indicator 315 and indicator 330 may be illuminated using a single fiber optic wire that is routed within the DC plug 310 in a manner that provides light to both indicators 315 and 330. In embodiments where connector 320 and the power port of IHS 325 support insertion of connector 320 in two orientations, DC plug 310 may be reversibly coupled to IHS 325 such that either indicator 310 or indicator 330 remains visible to the user. In such embodiments, the DC plug 310 may utilize two light guides on opposite sides of connector 320, where both light guides feed light to a single fiber optic wire that illuminates indicators 315 and 330 and that may extend along the length of DC cord 305. In this manner, the indicators of DC plug 310 may receive light while in either orientation within a power port that includes a single light source, 320 or 335.

In certain of such embodiments where two light guides provided by DC plug 310 feed to a single fiber that illuminates both indicators of 315 and 330, no fiber optic wire is included along the length of the DC cord. Instead, certain of such embodiments may utilize light sources on each end of the DC cord, in particular the IHS on one end and the converter of the AC adapter on the other end, that each supply light to the indicators on the DC plug that is connected to the local power port. In such embodiments, the lack of an indicator by the DC plug on either end of DC cord may indicate that the non-illuminated end of the DC cord is not correctly coupled.

As illustrated in FIG. 3B, fiber optic wires 340 and 350 embedded in DC plug 310 may be illuminated, respectively, via light sources 335 and 345 of the IHS 325. As illustrated, light sources 335 and 345 may be located in close proximity to the power port of IHS 325 such that light sources 335 and 345 are positioned such that the may transmit light that can be received by light guides on the face of DC plug 310 and routed to the respective fiber optic wires 340 and 350. As described with regard to FIG. 1, an IHS 100 may include a power port controller 114 that may be configured to operate power port lights 130. In certain embodiments, the power port controller of IHS 325 may be configured to operate power port light sources 335 and 345 identically or independently.

In certain embodiments, light sources 335 and 345 may support illumination of indicators 315 and 330 in different colors. In certain embodiments, each of the light sources 335 and 345 may be comprised of multiple, different-colored LEDs that may be illuminated separately or in combination to generate a variety of colors that are transmitted to fiber optic wires 335 and 345. In other embodiments, each of the light sources 335 and 345 may be comprised using LEDs that are capable of illuminating in multiple colors. Based on configuration of light sources 335 and 345 by a power port controller of IHS 325, the brightness and color of these light sources may be adjusted in order to reflect various charging states by the AC adapter.

As described, light from a light source of an IHS may be received by a light guide of a DC plug 310 and transmitted along the length of DC cord 305 to an identical DC plug 310 on the other end of the DC cord, thus providing a reversible cable. In such reversible cable embodiments, the light is received at the light guide of the proximal DC plug 310 is transmitted along the length of the fiber optic wire embedded in the DC cord until the fiber optic wire terminates at the light guide of the distal DC plug. As such, when the distal DC plug remains uncoupled, light transmitted on the fiber optic wire exits the wire at the light guide of the distal DC plug. This provides users with an ability to utilize an unconnected DC cord as a flexible flashlight that is powered by light from the IHS and emits light from the light guide on the face of the unconnected, distal DC plug.

In the embodiments illustrated in FIGS. 3A and 3B, the DC plug 310 and connector 320 are representative of a USB-C type connector and plug. A USB-C connector includes pins that support various USB protocols for communication of data and for transfer of electrical power. In certain embodiments, selected data pins of a USB-C connector 320 may be used as a data channel to provide information for configuration of light sources 335 and 345 in order to illuminate indicators 315 and 330. An AC adapter may be configured to supply information specifying characteristics of the adapter to the IHS via a data channel supported by one or more of the data pins of a USB-C coupling. The power port controller of an IHS 325 may be configured to utilize characteristics of the AC adapter provided via the data channel in order to configure illumination of indicators 315 and 330 via transmission of light to fiber optic wires 340 and 350.

In the embodiments illustrated in FIGS. 3A and 3B, DC connector 310 is a multi-pin USB-C connector that may support two different orientations within the power port of the IHS. The two orientations of DC connector 320 are achieved by rotating DC plug 310 by 180 degrees. As illustrated in FIG. 3B, DC plug 310 may include an indicator 330 on the opposite face of the DC plug from indicator 315, thus allowing either indicator 315 or indicator 330 to remain visible to the user regardless of the orientation of the DC plug 310 relative to the power port. In other embodiments, the DC connector 320 may be a barrel type connector that enclosed within a cylindrical DC plug. In such barrel type connectors, power may be transferred via the barrel portion of the connector and a data channel may be supported via a center pin included within the barrel. In such barrel type connector, the indicator light may be visible via a translucent ring that circles a circumference of the cylindrical barrel DC plug and that is illuminated by a fiber optic wire that is embedded below the translucent ring within the DC plug. Certain barrel connectors may include two concentric indicator rings where one ring is illuminated by one fiber optic cable embedded in the DC cord and the other ring is illuminated by a second fiber optic cable embedded in DC cord.

Figure 4:
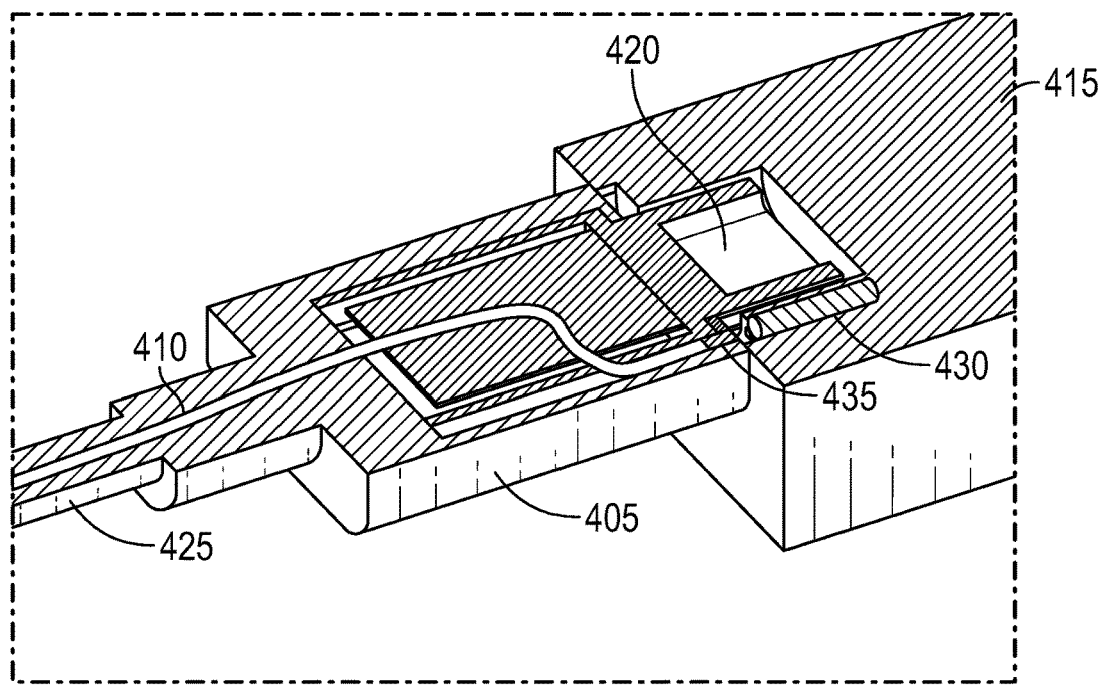
FIG. 4 is a diagram depicting certain components of a DC plug, according to various embodiments, of an AC power adapter, where the DC plug comprises indicator lights illuminated by an IHS.

FIG. 4 is a diagram illustrating a cutaway view of a DC plug 405 portion of an AC adapter according to various embodiments, where the DC plug 405 is coupled to a power port of an IHS 415. In the illustrated embodiment, the DC plug 405 includes a DC connector 420 that is compatible with a power port of IHS 415, such as a USB-C port. As illustrated, IHS 415 may include a light source 430 located adjacent to the power port that receives the DC connector 420. In certain embodiments, this light source 430 may be an LED, mini-LED or micro-LED that may be controlled by a power port controller of IHS 415, as described above. The position of light source 430 relative to the power port that receives the DC connector 420 may be selected to align with a lens 435 or other light guide that is incorporated within the face of the DC plug 405 that surrounds the DC connector 420.

In FIG. 4, a single light source 430 and single fiber optic wire 410 are illustrated. However, as described with regard to FIG. 3, certain embodiments may utilize additional light sources posited at other locations surrounding the power port of IHS. In such embodiments, each light source may correspond with an additional light guide and associated fiber optic wire embedded within the DC plug. Also as described above, certain DC plugs supporting two orientations may include two light guides, such as a light guide that is symmetrical to light guide 435 and that is located on the other side of the connector 420. In such DC plugs, fiber optic wires from each of the light guides may be joined to feed light to a single fiber optic wire embedded in the DC plug and extending the length of the DC cord.

As illustrated, DC plug 405 may include a fiber optic wire 410 that receives light from the light guide 435 and extends along the length of the DC power cord 425. In certain embodiments, the fiber optic wire 410 embedded in DC plug 405 may be routed such that wire 410 may illuminate a single indicator light on one face of the DC plug 405, such as indicator lights 315 or 330 of FIG. 3. In certain embodiments, a single fiber optic wire 410 may be routed within DC plug 405 such that it may illuminate indicator lights on both faces of the DC plug 405.

In certain embodiments, the fiber optic wire 410 may also be used to illuminate one or more indicator lights on a plug on the opposite end of DC power cord 425. For instance, fiber optic wire 410 may run the length of DC cord 425 and may illuminate indicators within a DC plug that is identical to DC plug 405 and is located on the other end of DC cord 425. In certain embodiments, one or more indicators may be located along the length of the DC power cord 425. Such indicators along the length of the DC power cord 425 may be illuminated by the fiber optic wire 410 running along the length of the DC cord 425. In certain embodiments, all or portions of the fiber optic wire 410 may remain visible along the length of DC power cord 425. In such embodiments, fiber optic wire 410 may remain directly visible or may be used to illuminate certain translucent portions of the casing of the DC power cord 425. In certain embodiments, fiber optic wire 410 may be embedded within the DC power cord 425 such that the fiber optic wire 410 is visible as an illuminated wire that runs along the length of the DC power cord 425 connecting DC plug 405 to a corresponding plug on the other end of the DC power cord 425.

In this manner, a single light source 430 may be used to illuminate multiple indicators included within the AC adapter, including indicators in DC plug 405, indicators along the length of DC power cord 425 and indicators in the plug on the opposite end of the DC power cord 425. Rather than utilizing separate light sources at each end of the DC power cord 425, embodiments may utilize a single light source, thus allowing multiple indicators along the length of the DC power cord to be illuminated identically, while using a single operation by a single light source. As described with regard to FIG. 3, in certain embodiments, multiple light sources may be supported and DC plugs may be utilized that utilize separate fiber optic wires for each light guide that receives light from these multiple light sources. In such embodiments, each fiber optic wire may be illuminated by a different light source, thus providing a capability for illuminating different indicators of the AC adapter with different colors and intensities of light.

For instance, embodiments utilizing two light sources may illuminate respective fiber optic wires that remain visible along the length of the DC power cord, where each light source may illuminate using a different color, thus illuminating wires along the length of the DC power cord in different colors. In certain embodiments, multiple fiber optic wires running the length of the DC power cord may be embedded within the DC power cord such that various patterns of illumination may be generated along the length of the DC power cord. Patterns of illumination may also be generated by using multiple fiber optic wires to illuminate various configurations of translucent portions of the casing of DC power cord. In certain embodiments, the power port controller may operate multiple light sources in various patterns, such as by flashing illuminators off and on, varying the intensity of the illuminators and changing the color of illuminators, where such patterns may be configured through the selection of visualization profiles.

Although the light source 430 has been described as a component of an IHS 415, in certain embodiments, light sources 430 may instead be generated by a component of the AC adapter and transmitted along the length of the DC power cord. For instance, the described light sources may instead be incorporated within the converter 210c of FIG. 2 and may be used to illuminate the indicators along the length of the DC power cord as described herein. In embodiments where the DC power cord utilizes identical plugs and connectors on each end, such a USB-C cable, identical lens structures on each plug allow the DC power cord to be reversed while still supporting illumination by a light source located within the IHS, or within the converter portion of the AC adapter.

In certain embodiments, single light sources may be provided by an IHS and by converter, thus providing one light source at each end of a DC cord. In such embodiments, the light source of each may be utilized to illuminate a different set of indicators and a different fiber optic wire in DC power cord. As described, certain DC power cords may be reversible, and the DC plugs in such reversible DC cords may be inserted within a power port in two orientations, each at 180 degrees to each other. For instance, a USB-C cord may be reversible and may support two orientations of a plug within a USB-C port. In certain embodiments, such types of DC cords may include two light guides, each providing light to a separate fiber optic wire that may illuminate one or more indicators on both DC plugs and along the length of the DC cord. Utilizing such a cord, in embodiments, such as illustrated in FIG. 4, that utilize a single light source 430, such light sources of the IHS and the converter may be positioned on opposite sides of connector 420, such that each light source illuminates a different fiber optic wire embedded within the DC cord. In such embodiments, a successful coupling of either end of the DC cord provides a light source that may be used as a flexible flashlight for use in coupling the other end of the DC cord.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An AC (Alternating Current) adapter for charging an Information Handling System (IHS), the AC adapter comprising:
a first DC (Direct Current) plug that is received by a power port of the IHS and that comprises a DC connector that provides power to the IHS via the power port, wherein the first DC plug comprises a first light guide that is adjacent to the DC connector and that receives a light that is transmitted from the IHS, and wherein the light received by the first light guide adjacent to the DC connector illuminates an indicator of the first DC plug, and wherein the illuminated indicator is visible to a user of the IHS by viewing the first DC plug coupled to the power port of the IHS.

2. The AC adapter of claim 1, wherein the first DC plug comprises a fiber optic wire that receives the light received by the first light guide and routes a portion of the light transmitted from the IHS for illumination of the indicator of the first DC plug.

3. The AC adapter of claim 2, further comprising a DC cord extending from the first DC plug, wherein the fiber optic wire comprised within the first DC plug extends within the DC cord and routes another portion of the light transmitted from the IHS to an additional indicator of the AC adapter.

4. The AC adapter of claim 3, further comprising a second DC plug that comprises that additional indicator and that is connected to a second end of the DC cord, wherein the fiber optic wire extending within the DC cord illuminates the additional indicator of the second DC plug.

5. The AC adapter of claim 3, wherein the DC cord comprises one or more indicators that are visible to the user and that are illuminated by the fiber optic wire extending within the DC cord.

6. The AC adapter of claim 3, wherein the fiber optic wire terminates at a light guide of the second DC plug and wherein a portion of the light received by the second DC plug exits the second DC plug when uncoupled from the IHS such that a user of the IHS uses the portion of the lighting the second DC plug as a light source.

7. The AC adapter of claim 1, wherein the first indicator is illuminated to indicate a charging state of the IHS.

8. An Information Handling System (IHS), the IHS comprising:
a first power port that received power from a DC connector of a first DC (Direct Current) plug of an AC adapter;
a first light source that is adjacent to a portion of the power port that receives power from the DC connector of the AC adapter, wherein the first light source is operable for transmitting light for reception by a first light guide of the first DC plug when the DC connector is coupled to the first power port, wherein the first light guide is adjacent to the DC connector of the first DC plug; and
a power port controller configured to initiate transmissions by the first light source to indicate a charging status of the IHS by illuminating one or more indicators of the AC adapter.

9. The IHS of claim 8, further comprising:
a second light source that is also adjacent to the portion of the power port that receives power from the DC connector of the AC adapter, wherein the second light source is operable for transmitting light for reception by a second light guide of the first DC plug when the DC connector is coupled to the first power port, wherein the second light guide is also adjacent to the DC connector of the first DC plug.

10. The IHS of claim 8, wherein the first light source transmission received by the first light guide illuminates an indicator portion of the first DC plug.

11. The IHS of claim 10, wherein the first light source transmission received by the first light guide is transmitted along a fiber optic wire extending from the first light guide along the length of a DC cord extending at a first end from the first DC plug.

12. The IHS of claim 11, wherein the power port controller determines the intensity of the transmitted light based on the length of the DC cord.

13. A system for charging an Information Handling System (IHS), the system comprising:
an AC adapter comprising a first DC (Direct Current) plug including a DC connector that delivers DC power to a power port of the IHS, wherein the first DC plug comprises a first light guide that is adjacent to the DC connector and that receives a light that is transmitted from the IHS, and wherein the light received by the first light guide adjacent to the DC connector illuminates an indicator portion of the first DC plug, and wherein the illuminated indicator portion is visible to a user of the IHS by viewing the first DC plug that is coupled to the power port of the IHS; and
a first power port of the IHS, wherein the first power port comprises a first light source that is adjacent to a portion of the power port that receives power from the DC connector of the AC adapter, wherein the first light source is operable for transmitting the light received by the first light guide when the DC connector is coupled to the first power port.

14. The system of claim 13, wherein the first DC plug comprises a fiber optic wire that receives the light received by the first light guide adjacent to the DC connector and that illuminates the indicator portion of the first DC plug.

15. The system of claim 14, further comprising a DC cord extending at a first end from the first DC plug, wherein the fiber optic wire comprised within the first DC plug extends within the DC cord.

16. The system of claim 15, further comprising a second DC plug connected to a second end of the DC cord, wherein the fiber optic wire extending from within the DC cord illuminates an indicator portion of the second DC plug.

17. The system of claim 15, wherein the DC cord comprises one or more indicators illuminated by the fiber optic wire extending within the DC cord.

18. The system of claim 13, wherein the first light guide adjacent to the DC connector aligns with the first light source that is adjacent to a portion of the first power port that receives power from the DC connector upon insertion of the DC connector in the first power port.

19. The system of claim 13, wherein the power port further comprises a second light source operable for transmitting light for reception by a second light guide of the first DC plug when the DC connector is coupled to the first power port.

20. The system of claim 13, wherein the power port controller is further configured to initiate transmissions by the first light source to indicate a charging status of the IHS.

* * * * *